(12) United States Patent
Hashimi et al.

(10) Patent No.: US 8,592,951 B2
(45) Date of Patent: Nov. 26, 2013

(54) SEMICONDUCTOR WAFER HAVING W-SHAPED DUMMY METAL FILLING SECTION WITHIN MONITOR REGION

(75) Inventors: Kazuo Hashimi, Kawasaki (JP); Hidekazu Sato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/429,804

(22) Filed: Mar. 26, 2012

(65) Prior Publication Data
US 2012/0181671 A1 Jul. 19, 2012

Related U.S. Application Data

(62) Division of application No. 12/622,704, filed on Nov. 20, 2009, now Pat. No. 8,163,572, which is a division of application No. 11/407,918, filed on Apr. 21, 2006, now Pat. No. 7,691,649.

(30) Foreign Application Priority Data

Dec. 19, 2005 (JP) ................................. 2005-365074

(51) Int. Cl.
*H01L 23/544* (2006.01)
(52) U.S. Cl.
USPC ............................. 257/620; 257/368; 438/14
(58) Field of Classification Search
CPC .................................................... H01L 23/544
See application file for complete search history.

(56) References Cited

U.S. PATENT DOCUMENTS

| 5,410,161 | A | 4/1995 | Narita |
| 5,981,967 | A | 11/1999 | Luo |
| 6,306,755 | B1 * | 10/2001 | Zheng ........................... 438/631 |
| 6,509,197 | B1 | 1/2003 | Satya et al. |
| 2004/0142546 | A1 * | 7/2004 | Kudo et al. .................... 438/585 |
| 2005/0118810 | A1 | 6/2005 | Harada et al. |
| 2005/0285203 | A1 | 12/2005 | Fukutome et al. |

FOREIGN PATENT DOCUMENTS

| JP | 3-102819 A | 4/1991 |
| JP | 3-280532 A | 12/1991 |
| JP | 5-21557 A | 1/1993 |
| JP | 8-37218 A | 2/1996 |

(Continued)

OTHER PUBLICATIONS

Chinese Office Action dated Apr. 4, 2008 (mailing date), issued in corresponding Chinese patent Application No. 200610084766.8.

(Continued)

*Primary Examiner* — Walter H Swanson
(74) *Attorney, Agent, or Firm* — Westerman, Hattori, Daniels & Adrian, LLP

(57) ABSTRACT

A method of manufacturing a semiconductor device forms the semiconductor device in a device region of a semiconductor substrate simultaneously with forming a monitor semiconductor device that includes a gate electrode made of silicon containing material arranged on a gate insulating film in a monitor region of the semiconductor substrate, a source electrode and a drain electrode formed on the semiconductor substrate on corresponding sides of the gate electrode. The gate electrode is removed without removing a gate insulating film by applying pyrolysis hydrogen generated by pyrolysis on the monitor semiconductor device in the monitor region, and the gate insulating film is removed by a wet process. Impurities distribution of a silicon active region appearing after the gate electrode is removed is measured and fed back to a semiconductor manufacturing process.

3 Claims, 12 Drawing Sheets

(56) References Cited

FOREIGN PATENT DOCUMENTS

| JP | 10-261683 | * | 9/1998 |
|---|---|---|---|
| JP | 2001-77195 A | | 3/2001 |
| JP | 2001-324439 A | | 11/2001 |
| JP | 2004-260003 A | | 9/2004 |
| WO | 2004/053928 A2 | | 6/2004 |

OTHER PUBLICATIONS

Etching effect of hydrogen plasma on electron cyclotron resonance—chemical vapor deposition and its application to low temperature Si selective epitaxial growth by K. Sasaki and T. Takada Japanese Journal of Applied Physics, Part 1: Regular Papers and Review Papers vol. 37, Issue 2, Feb. 1998, pp. 402-407.

Fujitsu Laboratories Limited "The world's first direct evaluation of impurities distribution under gate electrode"; Press Release, Dec. 14, 2004, [online], [searched on Dec. 8, 2010], URL,http://pr.fujitsu.com/jp/news/2004/12114-1.html (w/partial English translation).

Japanese Office Action dated Jan. 4, 2011, issued in corresponding Japanese Patent Application No. 2005-365074 (w/partial English translation).

Uchida, Kenji et al., "Novel chamber cleaning method using atomic hydrogen generated by hot catalyzer"; Thin Solid Films, vol. 395, (2001) pp. 75-77.

H. Fukutome et al., "Direct evaluation of Gate Line Edge Roughness Impact on Extension Profiles in Sub-50nm N-MOSFETs", 2004 IEEE.

Japanese Office Action dated Jan. 15, 2013, issued in corresponding Japanese patent application No. 2011-046182, w/ partial English translation.

* cited by examiner

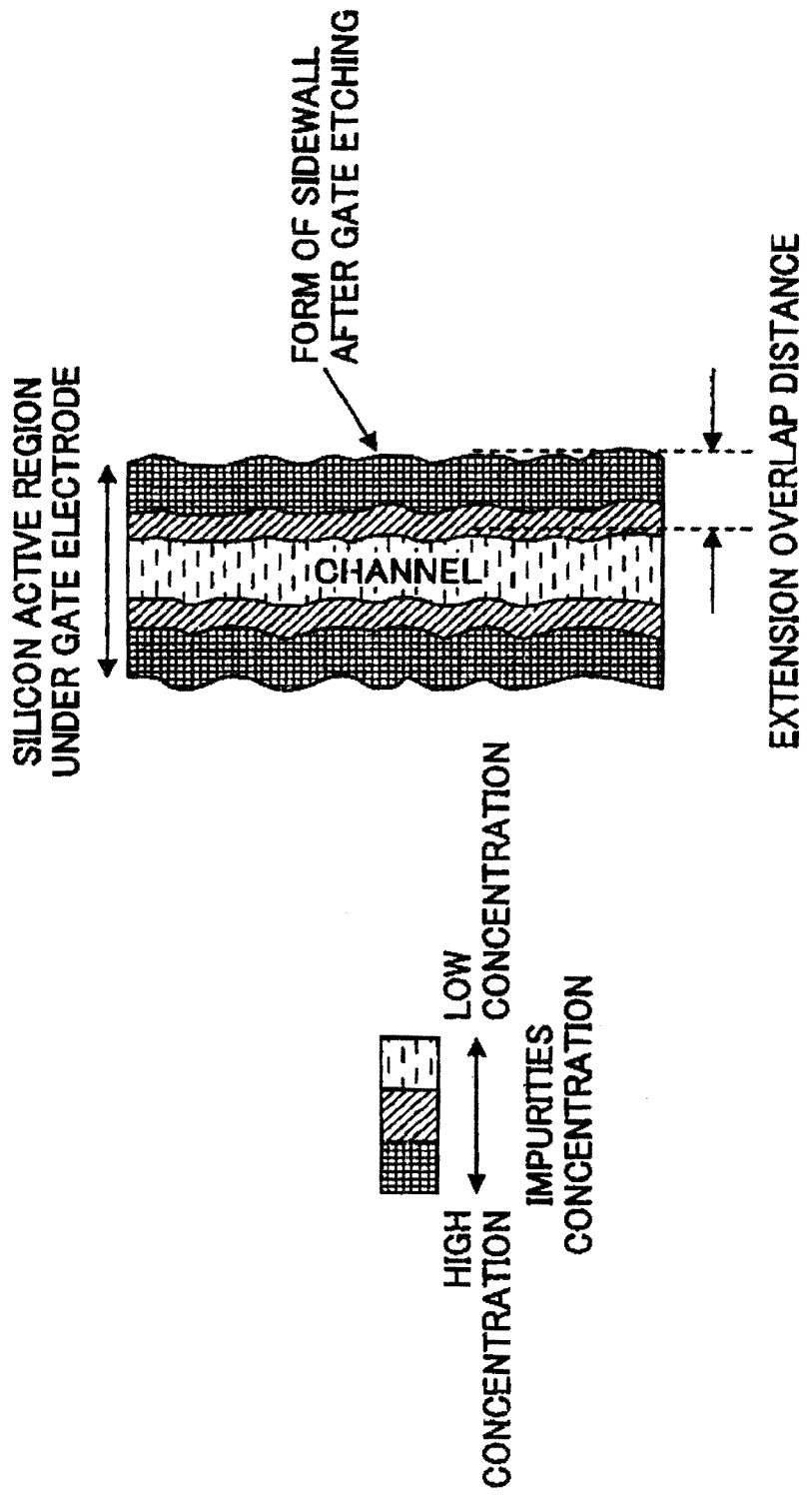

FIG.11
(a) LDMOS1
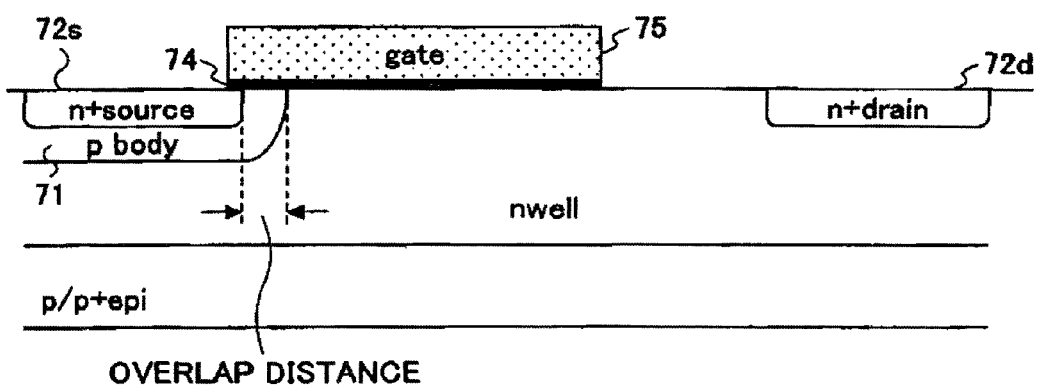
(b) LDMOS2
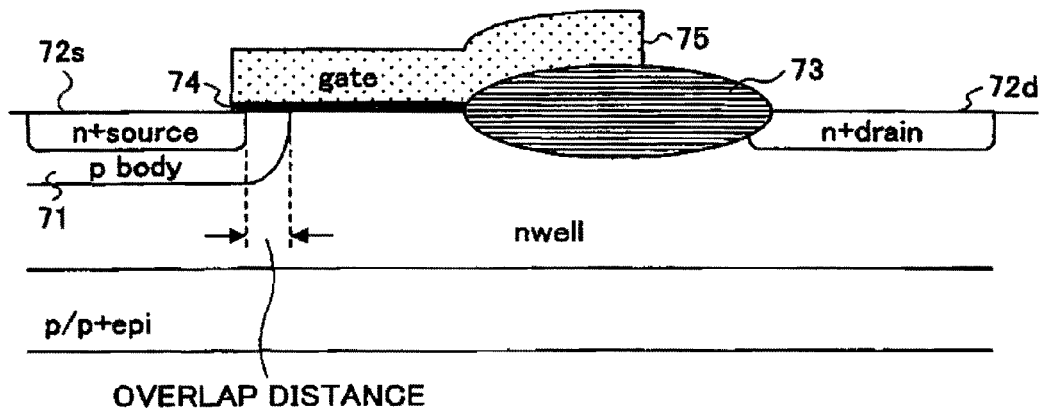

SEMICONDUCTOR WAFER HAVING W-SHAPED DUMMY METAL FILLING SECTION WITHIN MONITOR REGION

CROSS-REFERENCE TO RELATED APPLICATIONS

This application is a divisional application of Ser. No. 12/622,704, filed Nov. 20, 2009, which is a divisional application of Ser. No. 11/407,918, filed Apr. 21, 2006, now U.S. Pat. No. 7,691,649, which is based upon and claims the benefit of priority from the prior Japanese Patent Application No. 2005-365074, filed Dec. 19, 2005, the entire contents of which are hereby incorporated by reference.

BACKGROUND OF THE INVENTION

1. Field of the Invention

The present invention generally relates to a semiconductor device, and a manufacturing method thereof, and especially relates to a method of evaluating impurities distribution of a silicon active region under a gate electrode, and a semiconductor device and its manufacturing method suitable for evaluation of such impurities distribution.

2. Description of the Related Art

With the "ubiquitous era" arriving, information apparatuses are required to be even more miniaturized, capable of providing even higher performance, and capable of operating with even less power. Detailed ruling (design rule) for LSIs used in, e.g., servers, digital household electric appliances, and cellular phones, is progressing. Developments of "45 nm-generation" transistors are advancing, wherein the line width of a gate electrode is less than 40 nm. For stable operations of LSIs that contain a great number of such detailed-ruling transistors, it is important that the performance of each transistor be uniform, so that a transistor manufacturing method that reduces variations in the performance becomes important.

If variations by etching to shape the form of gate electrodes of transistors are great, variations of operating characteristics of the transistors are great. Accordingly, for determining a cause of the variations of the transistor performance, a method of evaluating the processed form after etching the gate electrodes (gate LER, Gate Line Edge Roughness) by an electron microscope is widely used during manufacturing.

However, a variation of the processed form of the gate electrode observed by the electron microscope is not necessarily the same as the variation of the transistor performance. That is, even if the degree of the variation of the processed form of the gate electrode is the same as that of a transistor, the variations of the performance may differ from transistor to transistor. This is because of variation of impurities distribution at a boundary between a channel region and an extension region of the source-drain diffusion layer extending to a silicon active region under the gate electrode.

Accordingly, it is conceivable to directly measure and evaluate the impurities distribution in the active region with a scanning tunneling microscope (STM) by removing the gate electrode.

FIG. 1 shows an example wherein a conventional etching method is applied to the gate electrode removal for visually inspecting impurities distribution. On the left side of FIG. 1, at (a), a sidewall insulating film 106 is formed on a side wall of a poly silicon gate electrode 105 that is formed on a silicon substrate 101 through a gate insulating film (gate oxide film) 104. Further, a source electrode 102 and a drain electrode 102 are formed on the silicon substrate 101, with a channel 103 in between. As described above, an extension overlap distance (D) of the source electrode and the drain electrode 102 projecting to the silicon active region directly under the gate electrode 105 is one of important parameters for estimating transistor characteristics. In order to obtain the extension overlap distance (D), measurement and evaluation of the impurities distribution are required.

Conventionally, wet etching by KOH, hydrofluoric acid-nitric acid (HF—HNO$_3$), organic alkali, and the like is performed for removing the gate electrode 105, which is made of poly silicon, and an etching selectivity of the poly silicon to a gate insulating film is taken. However, since precise adjustment of the mixing ratio and process temperature is difficult, the gate insulating film 104 and the active region thereunder are often removed as shown on the right of FIG. 1 at (b). That is, a damage section 108 is generated in the substrate silicon, and consequently, it is impossible to correctly measure the impurities distribution.

In the case of the technology of less than 0.13 μm, the performance degradation due to depletion of gate electrodes of MOSFETs is serious, and attempts are made wherein metal is used for the gate electrode. In this case, it is difficult to manufacture MOSFETs by the same technique as the conventional poly silicon gate. As a result, the technology called the replacement gate or damascene gate is widely used. According to the replacement gate method, a typical manufacturing process is as follows: a source and a drain are formed using a dummy polysilicon; an insulator layer is covered; the gate surface is appeared by a CMP (Chemical-Mechanical Polishing) method; the dummy gate is selectively etched; and then a gate insulation film and a metal gate electrode are formed.

In the manufacturing process as described above (the replacement gate), the same problem of seriously damaging a channel layer arises, because the gate insulating film is also removed when selectively removing the dummy gate. As described above, it is difficult to obtain a satisfactory etching selectivity with the conventional wet process, and the substrate silicon is often damaged. Although there have been attempts to solve the problem by structuring the dummy gate with three layers of Poly/SiN/SiO2, this increases the number of manufacturing steps, which is not desirable.

Further, in order to solve the problem, another method of removing only the gate electrode 105 made of poly silicon without melting the gate insulating film 104 is proposed, wherein a solution of TMAH (tetrapod methyl ammonium hydro-oxide) is used and conditions of a TMAH process are optimized (for example, Non-Patent Reference 1).

[Non-Patent Reference 1] H. Fukutomo, et al., "Direct evaluation of Gate Line Roughness Impact on Extension Profiles in Sub-50 nm N-MOSFETs", IEDM Tech. Dig., pp. 433-436, December 2004.

DESCRIPTION OF THE INVENTION

Problem(s) to be Solved by the Invention

Even with the TMAH process that may be optimized for removing only the poly silicon-gate electrode 105 and leaving the gate insulating film 104, optimization of conditions and control of the etching selectivity are still difficult, and it is not certain whether only the gate insulating film 104 is left remaining. Since it is clear that as the thickness of a gate insulating film becomes smaller and smaller, a gate removal method whereby a gate insulating film is surely to remain is desired.

SUMMARY OF THE INVENTION

Then, the present invention provides an evaluation method of a semiconductor device, wherein exact evaluation of impurities distribution in the silicon active region under a gate electrode is stably performed without damaging a silicon substrate, the method substantially obviating one or more of the problems caused by the limitations and disadvantages of the related art.

Further, the present invention provides a method of efficiently manufacturing the semiconductor device, variations in operations of which are reduced, the manufacturing method being based on an evaluation result of the impurities distribution in the silicon active region under the gate electrode.

Furthermore, the present invention provides a semiconductor wafer that includes the semiconductor devices as described above.

Features of embodiments of the present invention are set forth in the description that follows, and in part become apparent from the description and the accompanying drawings, or may be learned by practice of the invention according to the teachings provided in the description. Problem solutions provided by an embodiment of the present invention are realized and attained by a semiconductor device, a manufacturing method thereof, and an evaluation method of the semiconductor device particularly pointed out in the specification in such full, clear, concise, and exact terms as to enable a person having ordinary skill in the art to practice the invention.

To achieve these solutions and in accordance with an aspect of the invention, as embodied and broadly described herein, an embodiment of the invention provides a semiconductor device, a manufacturing method thereof, and an evaluation method of the semiconductor device as follows.

Means for Solving the Problem

A preferred embodiment of the present invention provides a gate electrode removing method wherein a high etching selectivity can be obtained between a gate insulating film and a gate electrode.

Specifically, pyrolysis hydrogen is used for removing the gate electrode; in this way, even if the gate electrode is on a thin gate insulating film having a thickness of several nm or less, only the gate electrode is removed. After observing the form of the gate insulating film that remains, or the form of a sidewall insulating film, the gate insulating film is removed by using dilute hydrofluoric acid. In this way, impurities distribution can be correctly measured and evaluated without damaging the active region. Further, a correlation between the processed form of the gate and the impurities distribution in the silicon active region under the gate electrode can be obtained.

The pyrolysis hydrogen is generated, e.g., with hydrogen molecules contacting a high melting point metal catalyst heated at about 1800° C.

An aspect of the present invention provides an evaluation method of a semiconductor device. The semiconductor device includes a gate electrode that is made of a silicon containing material, the gate electrode being located on a gate insulating film that is formed on a semiconductor substrate; and a source electrode and a drain electrode formed on the semiconductor substrate, which source electrode and the drain electrode sandwich the gate electrode. The evaluation method includes steps of (a) removing the gate electrode without removing the gate insulating film by the semiconductor device contacting the pyrolysis hydrogen, and (b) evaluating the form of the gate as processed in (a) above by observing the form of the gate insulating film that remains on the semiconductor substrate, or by observing the form of a sidewall insulating film.

Preferably, the evaluation method of the semiconductor device further includes the steps of (c) removing the gate insulating film that remains on the semiconductor substrate by a wet process, and (d) measuring and evaluating the impurities distribution in the silicon active region under the gate electrode.

Here, a process of estimating a correlation between the impurities distribution and the form of the processed gate can be added.

Another aspect of the present invention provides a manufacturing method of the semiconductor device. The manufacturing method includes steps of (a) forming a monitor semiconductor device in a monitor region of the semiconductor substrate, the monitor semiconductor device including a gate electrode consisting of silicon containing material arranged on the semiconductor substrate through a gate insulating film, a source electrode and a drain electrode formed on the semiconductor substrate on corresponding sides of the gate electrode simultaneously with a semiconductor device in a device region of the semiconductor substrate, (b) removing the gate electrode of the monitor semiconductor device in the monitor region without removing the gate insulating film by applying the pyrolysis hydrogen, (c) removing by a wet process the gate insulating film, and measuring the impurities distribution in the silicon active region under the gate electrode, and (d) feeding back a measurement result to the semiconductor manufacturing process.

For example, if the measurement result of the impurities distribution does not fulfill predetermined conditions, process conditions of the gate electrode are adjusted.

If the measurement result of the impurities distribution fulfills the predetermined conditions, the semiconductor manufacturing process is continued, and a semiconductor wafer is completed as it is.

Effect of the Invention

Correlation between the impurities distribution of the active region and the etching processed form of the gate electrode can be estimated without damaging the silicon active region.

Variations of the semiconductor devices manufactured as above can be reduced based on the evaluation result. Further, production efficiency can be improved, effectively using the semiconductor wafer in the middle of manufacturing.

BRIEF DESCRIPTION OF THE DRAWINGS

FIG. 4B is a plan view showing a result of impurities distribution measurement of a silicon active region appeared after removing a gate insulating film as shown at (d) of FIG. 4A;

FIG. 11 is a cross-sectional diagram showing an example wherein the present invention is applied to LDMOS.

DESCRIPTION OF THE PREFERRED EMBODIMENTS

In the following, embodiments of the present invention are described with reference to the accompanying drawings.

The principle of a gate electrode removing method of the present invention is described with reference to FIG. 2, wherein the method of the present invention is applied to the conventional removal process shown in FIG. 1.

Figure 1:
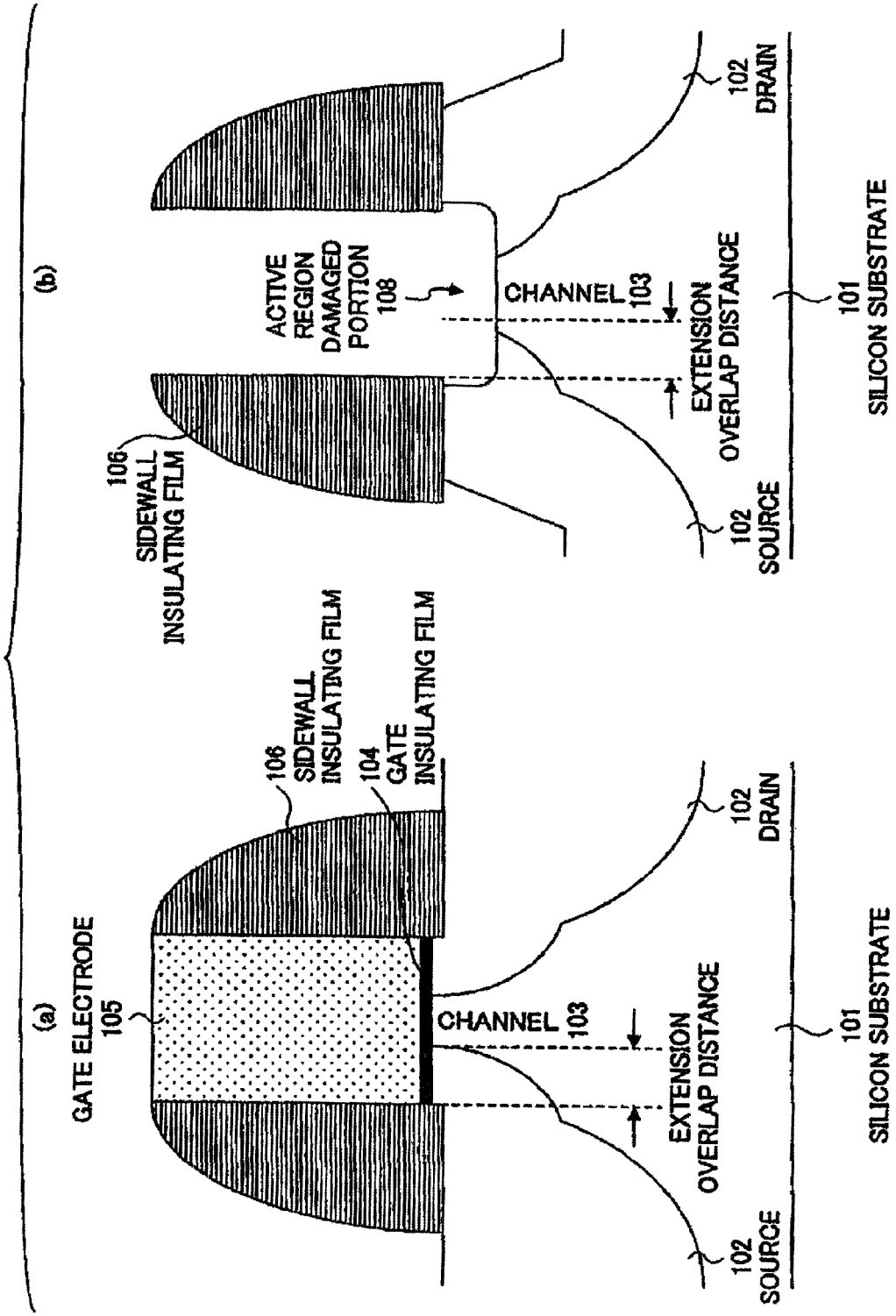
FIG. 1 is a cross-sectional diagram for explaining the conventional problem.

As shown at (a) of FIG. 1, a sidewall of a gate electrode 105 located on a gate insulating film 104 is covered by a sidewall insulating film 106, and a channel 103 directly under the gate electrode 105 is sandwiched by source and drain electrodes 102. A native oxide film formed on the wafer surface is removed with, e.g., dilute hydrofluoric acid, then, the wafer is put into a process chamber, and etching removal of the gate electrode, which is made of poly silicon, is carried out by pyrolysis hydrogen. The process chamber contains, e.g., a tungsten catalyst heated at about 1800° C., and hydrogen gas is introduced at pressure of 1.33 Pa and temperature of 420° C. The hydrogen gas contacts the heating catalyst, and is pyrolyzed into hydrogen atoms, which is called "pyrolysis hydrogen". The pyrolysis hydrogen reacts with the poly silicon electrode and the silicon substrate 101 outside of the sidewall insulating film 106 with a high etching selectivity, leaving the thin gate insulating film 104, and removing only the gate electrode. Here, although poly silicon is used as the gate electrode material, this technique is applicable to a gate electrode made of other materials that contain silicon, such as poly silicon germanium.

Figure 2:
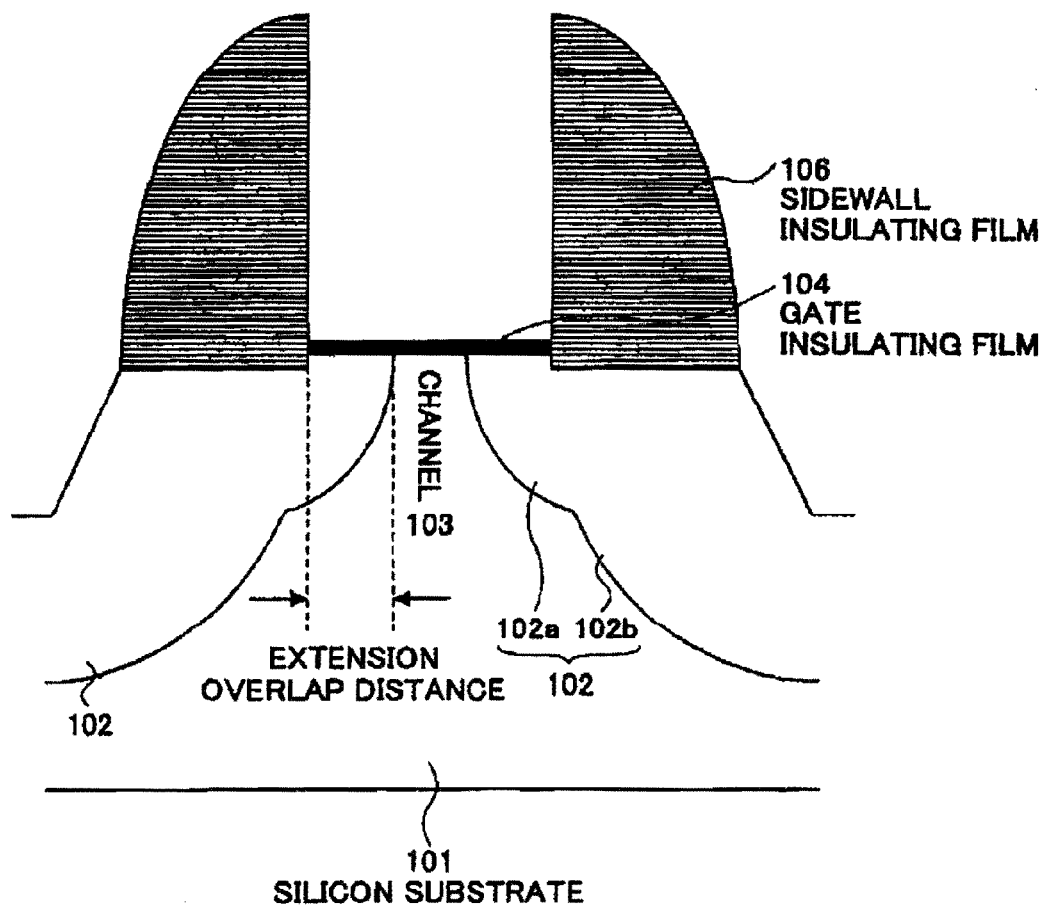
FIG. 2 is a cross-sectional diagram for explaining the principle of the present invention.

A manufacturing process of the semiconductor device according to the first embodiment of the present invention is shown in FIGS. 3 through 6, wherein an example of manufacturing and evaluating an actual semiconductor device is shown, to which example the principle described with reference to FIG. 2 is applied. Although the embodiment is described using a p-type MOS transistor, the same effect is obtained with an n-type MOS transistor.

Figure 3:
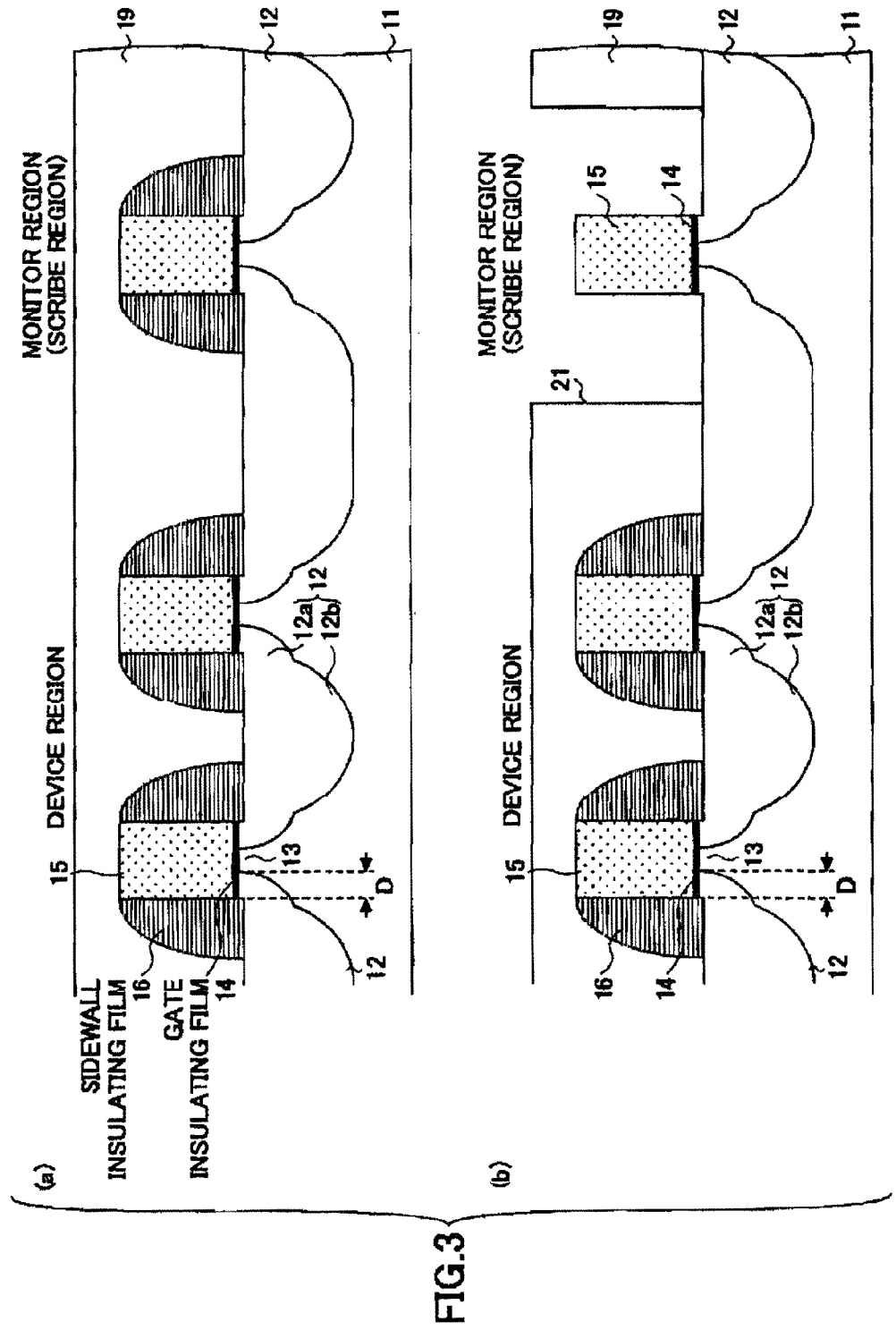
FIG. 3 is a cross-sectional diagram showing a manufacturing process (No. 1) of a semiconductor device according to the first embodiment of the present invention.

As shown at (a) of FIG. 3, the monitor region for measuring impurities distribution of a silicon active region is provided in a predetermined area of the semiconductor wafer. The monitor region may be provided for each chip, or each shot. Further, the monitor region may be prepared in a predetermined part of a chip. Further, two or more monitor regions may be provided in a scribe region for dividing chips. In any case, the gate insulating film and the gate electrode in the monitor region are simultaneously formed with transistors in the device region. Here, the monitor region may be separated from the device region by a device separating region (not illustrated in FIG. 3).

Specifically, a device separating region (not illustrated) is formed in a predetermined area of a p-type silicon substrate 11, the plane direction of which is (100). Next, a n-well (not illustrated) is formed in a p-type MOS-transistor formation region by carrying out ion implantation of n-type impurities, such as phosphor (P), in the silicon substrate 11 with acceleration energy of greater than 300 KeV and dose amount 1E13/cm$^2$ ($1\times10^{13}$/cm$^2$). Then, the surface of the silicon substrate 11 is thermally oxidized such that a gate insulating film 14 is formed on the whole surface for a desired thickness of 5.0 nm or less. In addition, although the gate insulating film 14 is usually made of silicon oxide, nitrogen may be added if needed. On the gate insulating film 14, a poly silicon film is grown for a thickness between 100 and 300 nm by a CVD method, which film is etched into a predetermined form, and a gate electrode 15 is formed. Then, an extended diffusion layer (extension region) 12a is formed by ion implantation of boron (B) as p-type impurities in the silicon substrate 11 using the gate electrode 15 as a mask with acceleration energy between 0.2 and 1.0 KeV and a dose amount between 1E14/cm$^2$ and 2E15/cm$^2$ ($1\times10^{14}$/cm$^2$ and $2\times10^{15}$/cm$^2$). By the plasma CVD method, a SiO$_2$ layer is formed on the whole surface as an insulator layer of the sidewall, and a sidewall insulating film 16 is formed by etching back. In addition, the insulator layer of the sidewall may be a silicon nitride layer. By using the sidewall insulating film 16 as a mask, ion implantation of boron (B) as p-type impurities is carried out to form a high concentration diffusion layer 12b, and an impurities layer 12 connected to the source electrode and the drain electrode is formed in the silicon substrate 11. Then, the whole surface is covered by a layer insulation film (e.g., a silicon oxide film) 19.

Next, the layer insulation film 19 and the sidewall insulating film 16 in the monitor region are removed as shown at (b) of FIG. 3, and the gate electrode 15 of the monitor region is appeared in a hole 21. For removing the layer insulation film 19 and the sidewall insulating film 16, dry etching is carried out using, for example, C$_4$F$_6$ gas. Here, the sidewall insulating film 16 does not have to be removed, but it may remain in whole or in part.

Figure 4A:
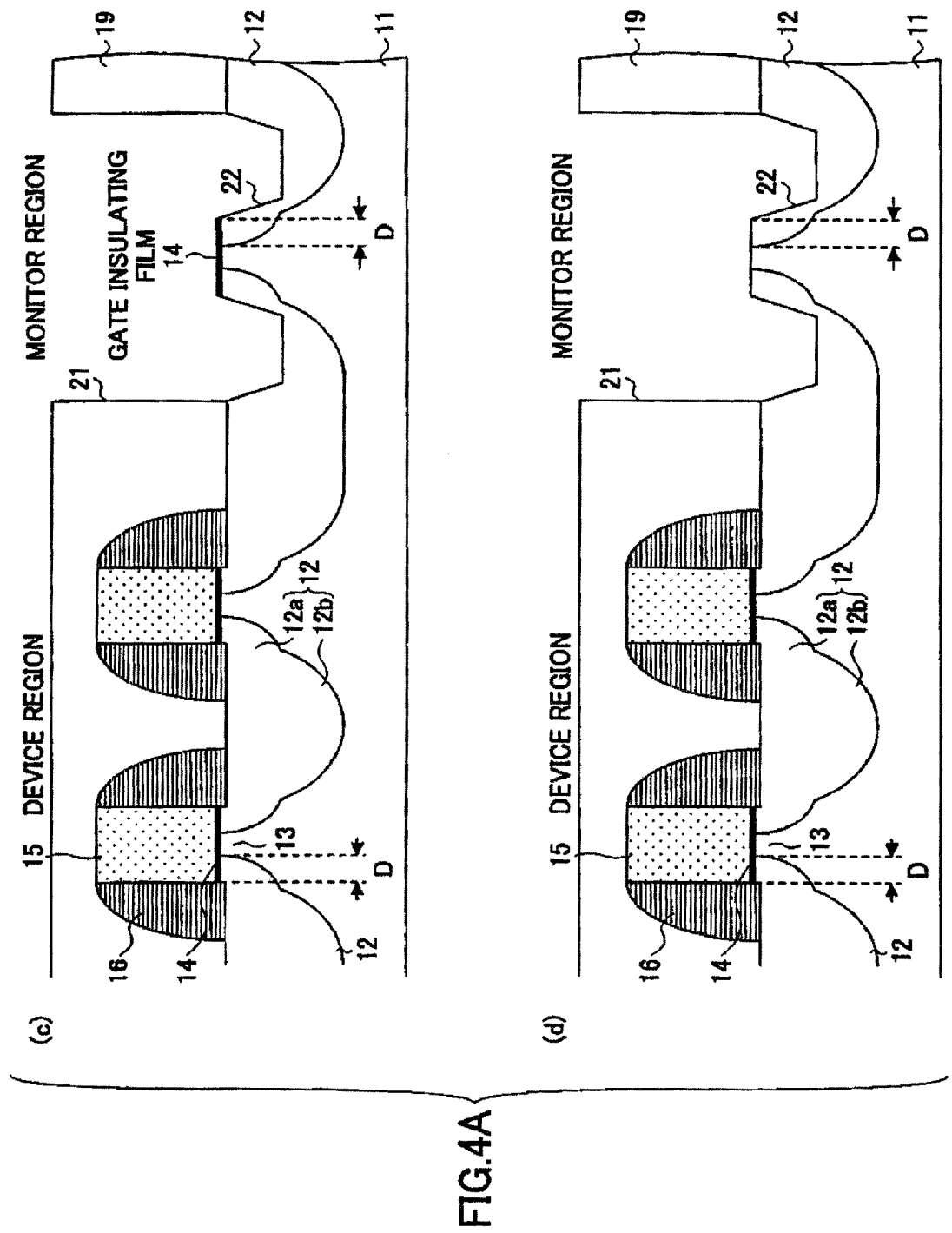
FIG. 4A is a cross-sectional diagram showing the manufacturing process (No. 2) of the semiconductor device according to the first embodiment of the present invention.

Next, after removing the native oxide film formed on the wafer surface by, e.g., dilute hydrofluoric acid, hydrogen (H$_2$) gas is introduced into a process chamber that contains a tungsten filament heated at 1800° C., then pyrolysis hydrogen is generated, and the poly silicon gate electrode 15 of the monitor region is removed by the pyrolysis hydrogen as shown at (c) of FIG. 4A. Although the surface of the appeared silicon substrate 11 may also be removed at this time, since it is etched in the shape of a taper without producing an undercut, a hole 22 having a cross-sectional form that looks like a letter "W" is formed. Therefore, damage to the silicon active region under the gate electrode is reduced. Further, when the pyrolysis hydrogen is used, the etching selectivity of the poly silicon to the gate insulating film 14 under the gate electrode becomes almost infinite. Consequently, only the gate electrode is removed, leaving the gate insulating film 14 remaining intact with high reliability, and the impurities distribution in the silicon active region in the extension overlap region extending directly under the gate can be maintained intact.

At this stage, the form of the appeared gate insulating film 14 is directly observed and is photographed, as desired, using the electron microscope. Since the form of the gate insulating film 14 corresponds to the form of the base of the gate electrode 15, it reflects the processed form of the gate electrode most correctly. Observing the form of the sidewall insulating film 16 also serves the purpose.

At this stage, inspection of a pinhole that may be present in the gate insulating film 14 is also possible. This is because, if there is a pinhole, the silicon substrate below is etched when the gate insulating film 14 is exposed to the pyrolysis hydrogen, and the pinhole is actualized.

Next, the gate insulating film 14 is removed as shown at (d) of FIG. 4A by a wet process using hydrofluoric acid. Then, the impurities distribution in the silicon active region under the gate electrode is measured and evaluated using a scanning tunneling microscope (STM). The measured impurities distribution is shown by FIG. 4B. In the silicon active region under the gate electrode, impurities concentration becomes higher in directions toward edges of the gate, the directions departing from a channel region 13. At this stage, the impurities distribution under the gate electrode, and an extension overlap distance (D) that is projected to the silicon active region under the gate electrode can be correctly measured.

Further, at this stage, an inspection is possible if a pinhole is present in the gate insulating film 14. This is because if there is a pinhole, when the gate insulating film 14 is exposed to pyrolysis hydrogen, the silicon substrate is etched and a pit is formed in the silicon active region.

The measured impurities concentration and/or extension overlap distance (D) is correlated with the etching processed form (Gate Line Edge Roughness) of the gate electrode, which is observed at the previous step, and actual correlation between the impurities distribution and the processed form of the gate can be evaluated. Further, whether there is a pinhole in the gate insulating film can be evaluated. In the case where a result of measurement and evaluation fills a predetermined criterion, the semiconductor manufacturing process of the wafer concerned is continued.

Figure 5:
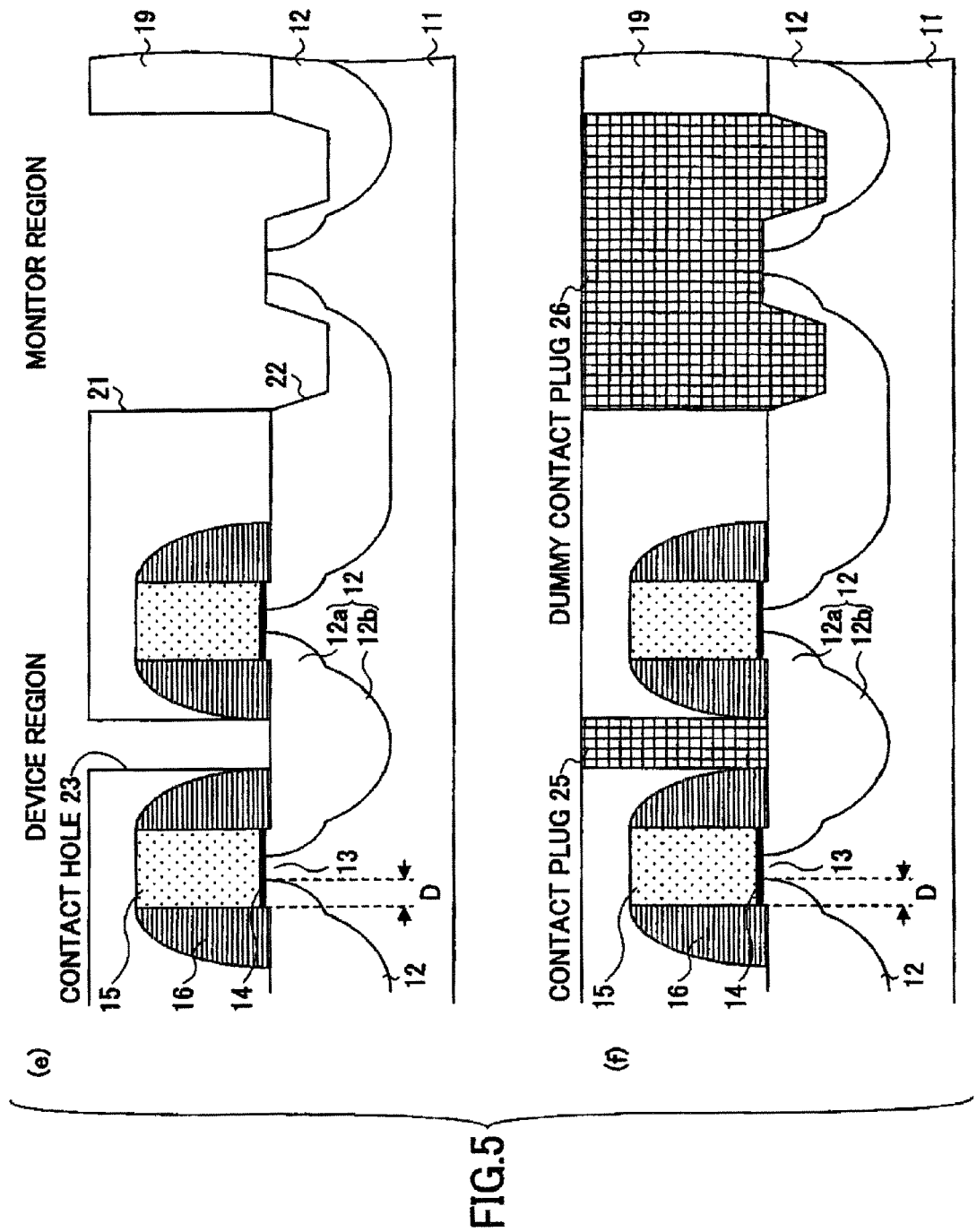
FIG. 5 is a cross-sectional diagram showing the manufacturing process (No. 3) of the semiconductor device according to the first embodiment of the present invention.

That is, as shown at (e) of FIG. 5, in the device region, a contact hole 23 that reaches the source/drain electrode 12 of the transistor is formed through the layer insulation film 19, and a mask (not illustrated) used in forming the contact hole is removed.

Next, as shown at (f) of FIG. 5, the inside of the contact hole 23 and the hole 21 of the monitor region are filled up with silicon system material, such as poly silicon, or metal material, such as tungsten, through a glue film (not illustrated), the surface is flattened, and a contact plug 25 and a dummy contact plug 26 are formed.

Figure 6:
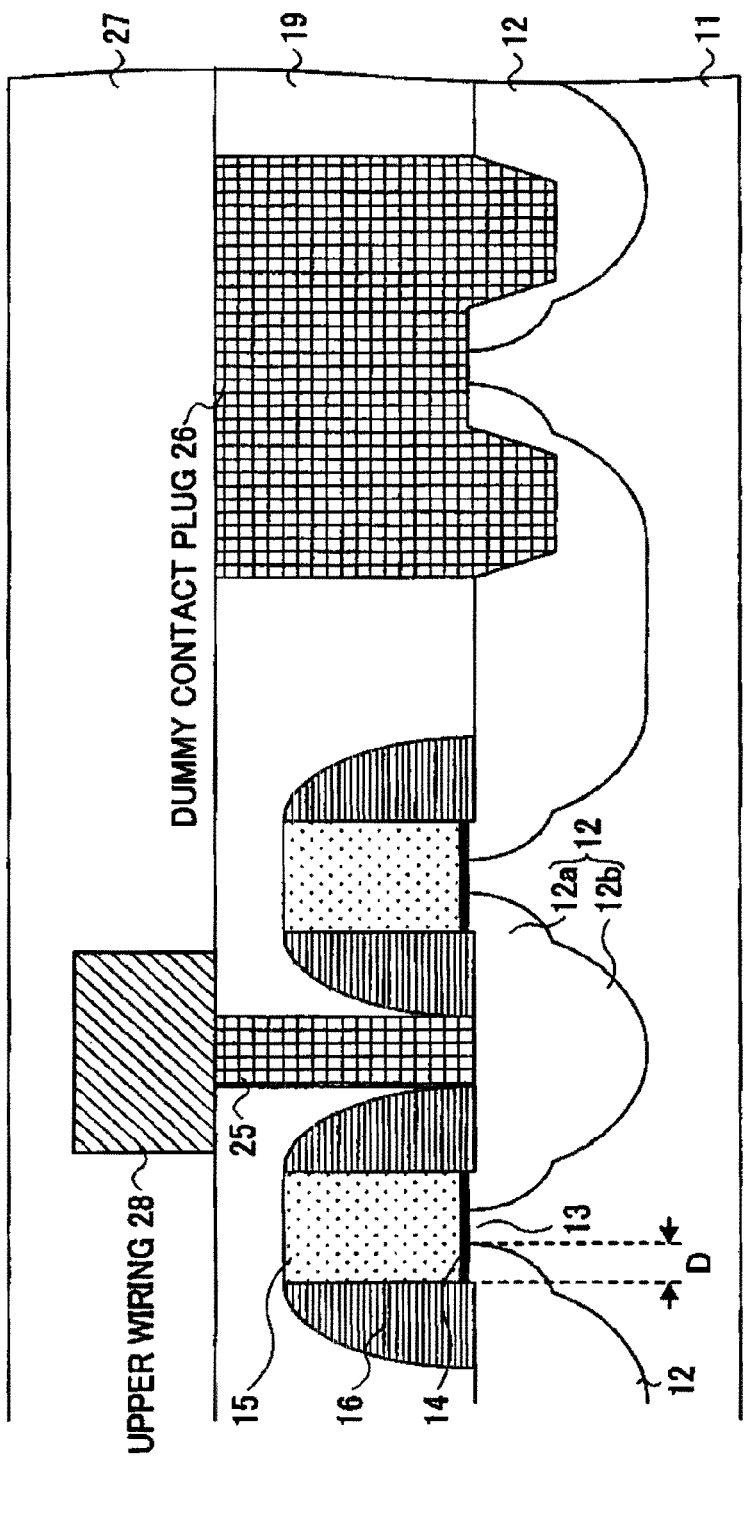
FIG. 6 a cross-sectional diagram showing the manufacturing process (No. 4) of the semiconductor device according to the first embodiment of the present invention.

Next, as shown at (g) of FIG. 6, an upper wiring 28 connected to the contact plug 25 is formed, a layer insulation film 27 is deposited, an upper plug and wiring may be formed, if required, and the semiconductor device is completed. Although the dummy plug shaped like the letter "W" is embedded at the monitor region of the completed wafer, it is not connected anywhere and operations of the semiconductor device are not influenced.

Figure 7:
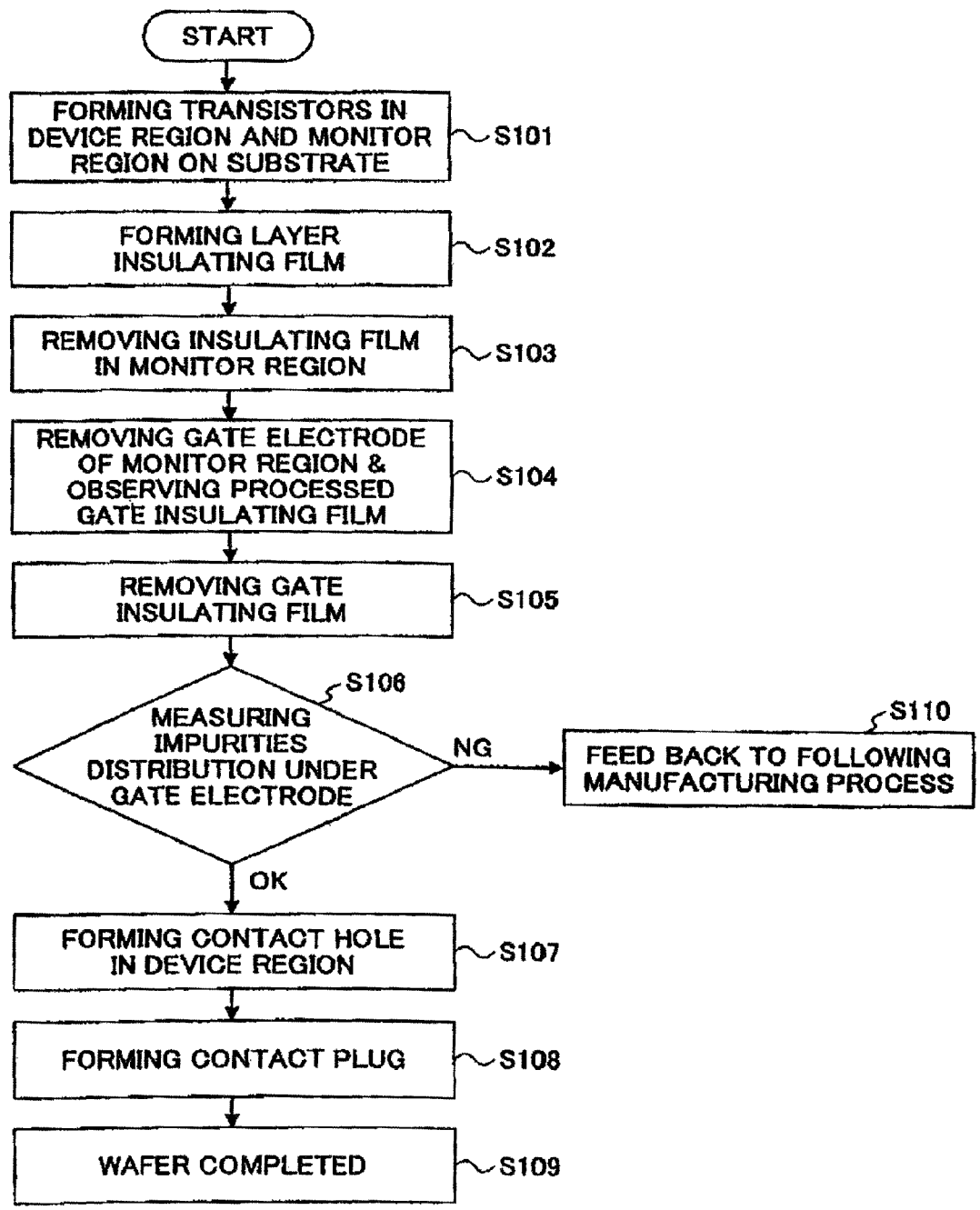
FIG. 7 is a flowchart of an evaluation method of the semiconductor device according to the first embodiment of the present invention.

FIG. 7 is a flowchart of the evaluation method of the semiconductor device according to the first embodiment of the present invention. First, a transistor that has a poly silicon gate is formed in the device region and the monitor region on a silicon substrate (S101). The whole surface of the silicon substrate and the transistor is covered with a layer insulation film that is deposited (S102). The layer insulation film of the monitor region is removed and the whole gate electrode for measurement and evaluation is appeared (S103). Pyrolysis hydrogen removes only the exposed gate electrode. Then, the processed form of the gate insulating film that remained is observed by an electron microscope (S104).

Next, a gate insulating film is removed by a wet processing using hydrofluoric acid (S105), and impurities distribution of the silicon active region under the gate electrode is measured and evaluated using a scanning tunneling microscope. Further, a pinhole inspection of the gate insulating film may be carried out. When an evaluation result fulfills predetermined conditions (for example, when the variation in a concentration distribution is within a predetermined limit), the manufacturing process is continued. That is, a contact hole that reaches the source/drain electrode is formed (S107), metal material is embedded inside of the hole, and a contact plug is formed in the layer insulation film of the device region (S108). Through other required manufacturing steps, the wafer is completed (S109).

In the case where the measurement of impurities distribution and the evaluation result do not satisfy predetermined conditions, the measurement result is fed back to the next product manufacturing process (S110). For example, when the evaluation result is slightly off the predetermined conditions, a margin of gate etching conditions is expanded; and when it is greatly off the predetermined conditions, a cause is determined and a countermeasure is taken, for example, gate etching conditions, impurities injecting conditions, heat treatment conditions that affect the impurity distribution are reviewed so that the impurities distribution of the silicon active region may turn into a predetermined distribution. In this way, the variation in the electrical characteristics of a final product is made within tolerance. Further, by collecting data of the correlation between the etching processed form and the actual impurities distribution, the performance of a transistor can be predicted based on the correlation data. Further, since the measurement and evaluation in the middle of the manufacturing process of an actual wafer does not affect the device region, manufacturing efficiency is improved.

Figure 8:
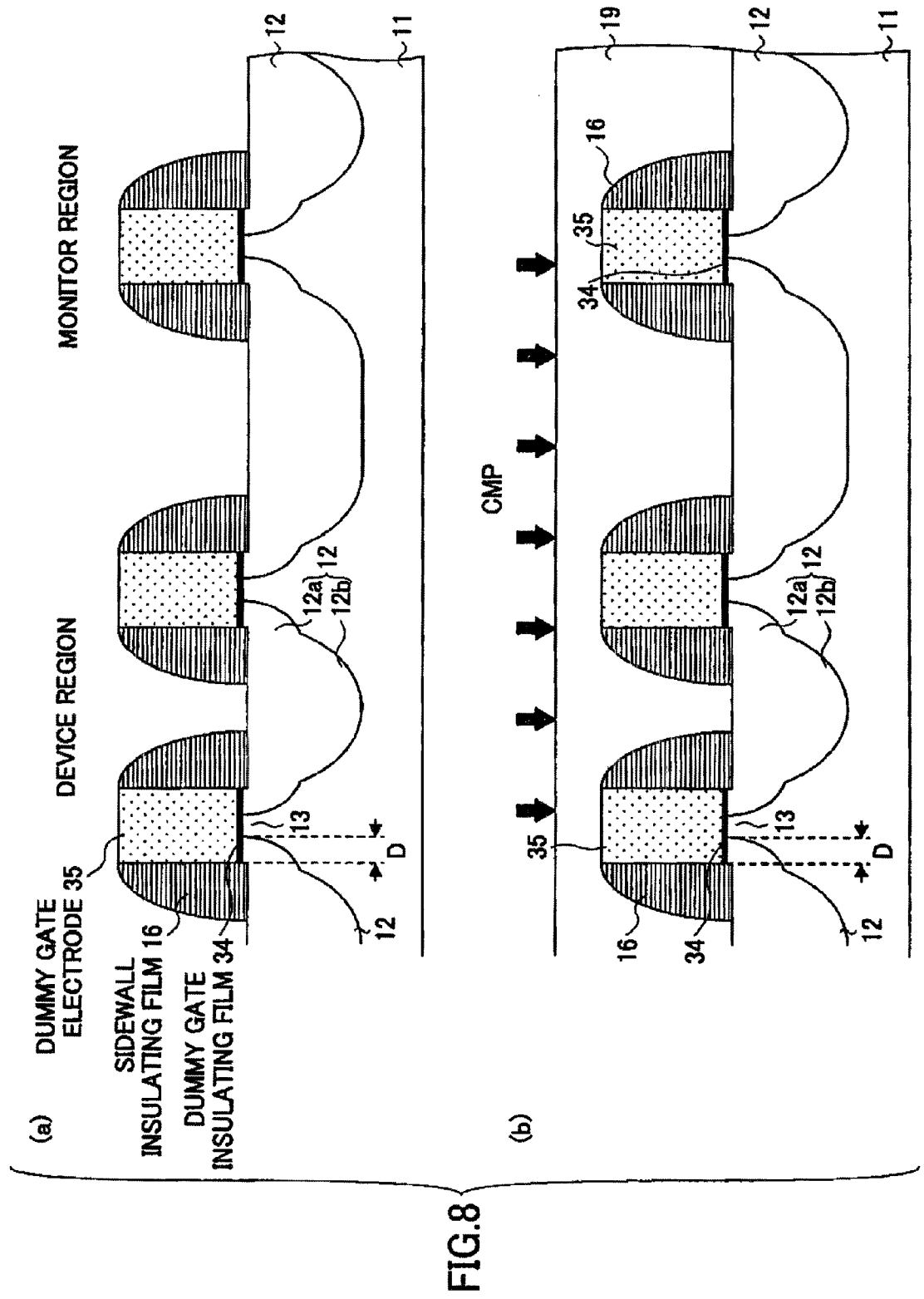
FIG. 8 is a cross-sectional diagram showing the manufacturing process (No. 1) of the semiconductor device according to the second embodiment of the present invention.
Figure 9:
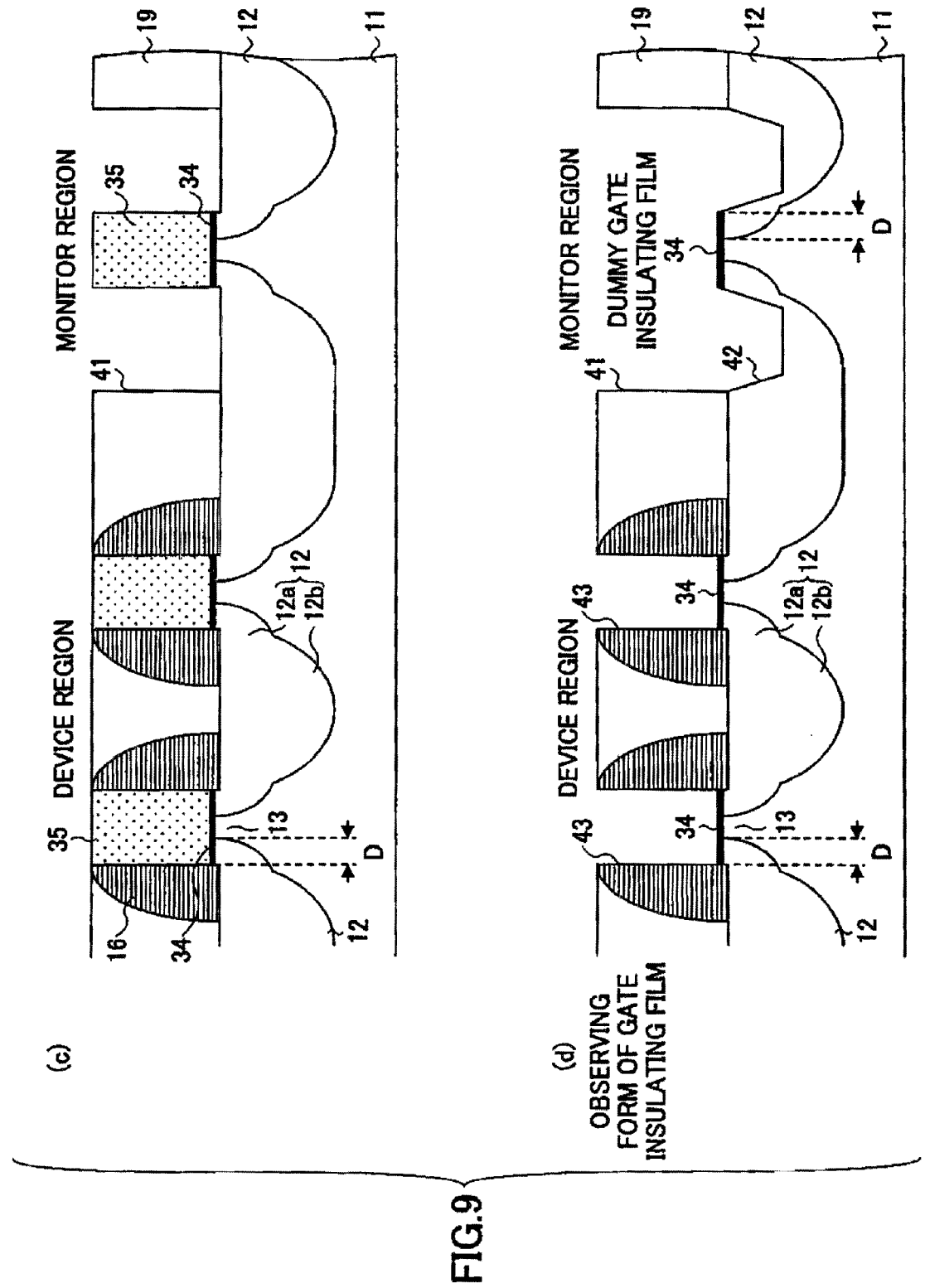
FIG. 9 is a cross-sectional diagram showing the manufacturing process (No. 2) of the semiconductor device according to the second embodiment of the present invention.
Figure 10:
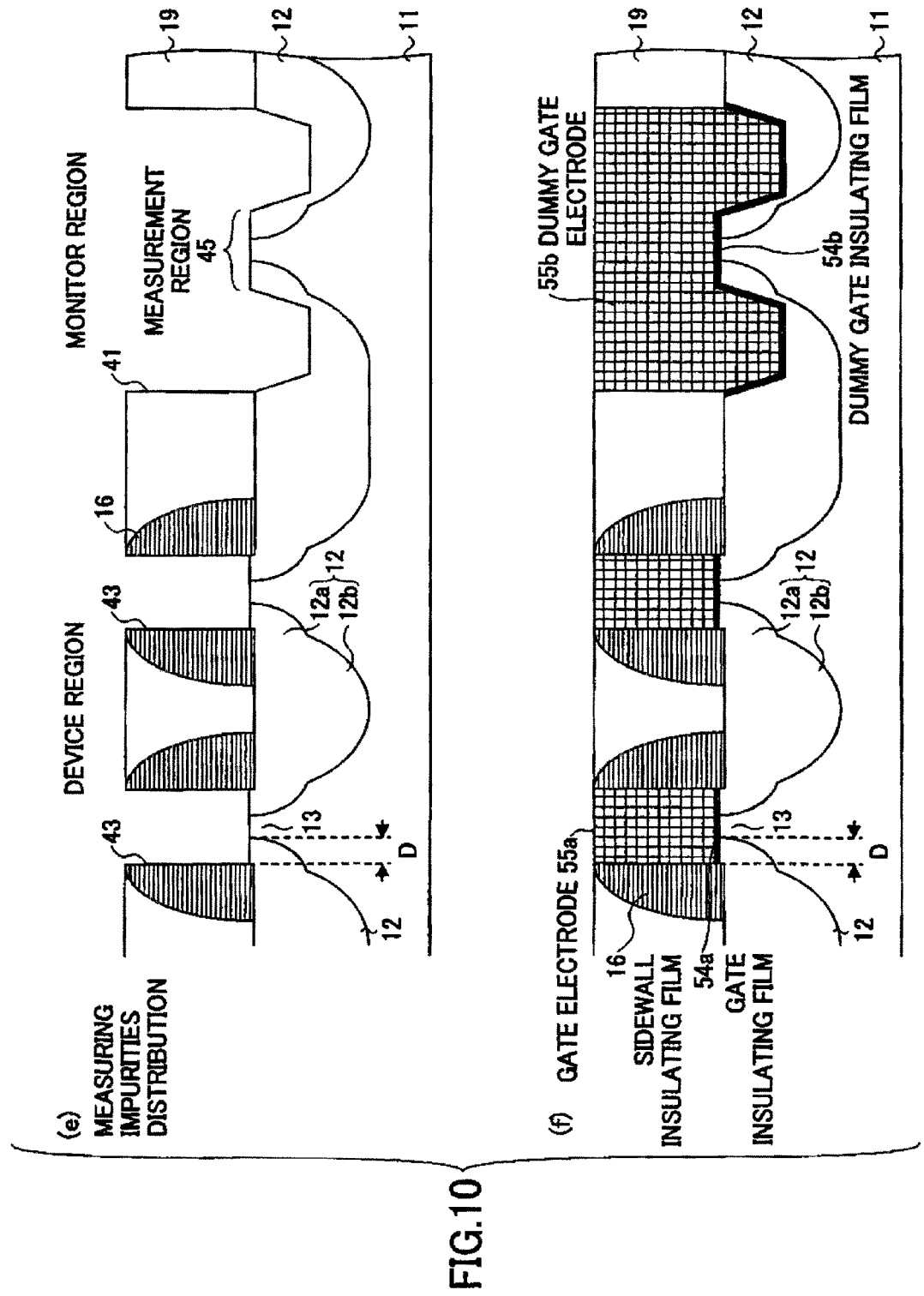
FIG. 10 is a cross-sectional diagram of the manufacturing process view (No. 3) of the semiconductor device according to the second embodiment of the present invention.

FIGS. 8 through 10 show the manufacturing process of the semiconductor device according to the second embodiment of the present invention, wherein the processed form of the gate and impurities distribution measurement are applied to production of a damascene gate.

First, as shown at (a) of FIG. 8, all over the semiconductor wafer, an insulated thin film is formed, and then a poly silicon film is formed. The films are etched into a predetermined form, and a dummy gate electrode 35 is formed in a device region and the monitor region through a dummy gate insulating film 34. A lightly doped drain (LDD) 12a is formed using the dummy gate electrode 35 as a mask, a high concentration diffusion layer 12b is formed using the sidewall insulating film 16 as a mask, and an impurity diffusion layer 12 that is connected to a source/drain electrode is formed. Then, the whole surface is covered by a layer insulation film (silicon oxide film) 19.

Next, by CMP, as shown at (b) of FIG. 8, the layer insulation film 19 is ground until the surface of the dummy gate electrode 35 is appeared.

Next, as shown at (c) of FIG. 9, the layer insulation film 19 and the sidewall insulating film 16 of the monitor region are removed, and the whole dummy gate electrode 35 is appeared in a hole 41. At this time, the surface of the dummy gate electrode 35 in the device region is also appeared.

Next, as shown at (d) of FIG. 9, hydrogen gas is put in contact with heated catalysts, such as tungsten, then pyrolysis hydrogen is generated and the dummy gate electrodes 35 of the device region and the monitor region are removed. Thereby, a hole 43 is formed between the sidewall insulating films 16 of the device region. Further, the bottom of the hole 41 of the monitor region is etched in the shape of the letter "W", and a taper-like groove 42 is formed on both sides of the gate insulating film 34. By the high selection ratio of pyrolysis hydrogen, the dummy gate insulating film 34 remains in the device region and the monitor region, without being etched. The processed form of the dummy gate insulating film 34 appeared in the hole 41 of the monitor region is visually inspected and/or photographed using an electron microscope.

Next, as shown at (e) of FIG. 10, by wet processing using hydrofluoric acid, the dummy gate insulating films 34 of the device region and the monitor region are removed, and the impurities distribution in a measurement region 45 in the hole 41 of the monitor region directly under the gate is measured and evaluated by a scanning tunneling microscope. When an evaluation result fulfills predetermined conditions, a damascene gate is formed with the following process.

That is, as shown at (f) of FIG. 10, an insulator layer is formed with material such as $SiO_2$, SiON, SiN and $Ta_2O_5$, and $HfO_2$, $Al_2O_3$. The insulator layer, which is a thin film, serves as a damascene gate insulating film 54a at the bottom of the hole 43 of the device region, and serves as a dummy gate insulating film 54b in the hole 41 of the monitor region. An unnecessary portion of the insulator layer is removed. Furthermore, metal material, such as aluminum, W, and Mo, is deposited on the whole surface. Thereby, a metal gate electrode 55a is formed in the hole 43 of the device region, and a dummy gate electrode 55b is formed in the hole 41 of the monitor region. Then, the semiconductor device is completed through required processes such as formation of a layer insulation film, formation of a contact plug, and formation of upper wiring.

As described above, the present invention is also applicable to the manufacturing process of a damascene gate, wherein correct measurement of the impurities distribution in the silicon active region under the gate electrode is possible without damaging the channel region. Further, the replacement gate (damascene gate) can be formed by a dry process with high controllability. Here, although the embodiments are described wherein poly silicon is used as the gate electrode, other silicon containing materials such as poly silicon germanium may be used.

FIG. 11 shows another embodiment wherein the present invention is applied to LDMOS (Lateral Double Diffused MOSFET). LDMOS is often used for a driving output such as a power amplifier. At LDMOS, each electrode is diffused in the lateral direction by two diffusion steps. Since the source and the drain are arranged on the same surface of a substrate, LDMOS can be contained in an integrated circuit.

At (a) of FIG. 11, an n-channel active gap LDMOS (LDMOS1) is shown. There is a gap between a drain electrode 72d and a gate edge, and an n-well that encloses the n+ drain 72d serves as a drift region. A p-body 71, which serves as the channel region (inversion layer formation region), self-aligns to one of the source electrode and the gate edge. At (b) of FIG. 11, an n-channel field gap LDMOS (LDMOS2) is shown. A part of a gate electrode 75 covers a thick field oxide film 73.

In the n-channel LDMOS, control of an overlap length from the gate edge of the p-body 71 used as the channel region is important for an operating characteristic. The present invention is applicable to determining a concentration profile of the p-body.

That is, LDMOS is formed in the monitor region like in the device region, only the gate electrode 75 of the monitor region is removed by pyrolysis hydrogen, and the form of the gate insulating film 74 is observed. Subsequently, the gate insulating film 74 is removed by wet etching using hydrofluoric acid, and the impurities distribution profile of the p-body 71 under the gate electrode is measured by a scanning tunneling microscope. A measurement result can be reflected to gate processing conditions, p-body formation conditions, etc., of a following wafer.

As described above, according to the present invention, correlation between the impurities distribution in the silicon active region under the gate electrode and the etching form of the gate electrode can be evaluated with a sufficient precision without damaging the silicon active region, and transistor performance can be predicted.

Further, since the manufacturing process can be continued to complete a product after evaluation, production efficiency is maintained high. Here, although the embodiment above is described wherein poly silicon is used as the gate electrode material, other silicon containing material such as poly silicon germanium may be used, and the above-described technique is still applicable.

Further, the present invention is not limited to these embodiments, but variations and modifications may be made without departing from the scope of the present invention.

The present application is based on Japanese Priority Application No. 2005-365074 filed on Dec. 19, 2005 with the Japanese Patent Office, the entire contents of which are hereby incorporated by reference.

What is claimed is:

1. A semiconductor wafer, comprising:
    a first impurity diffused region and a second impurity diffused region respectively formed in a semiconductor substrate;
    a first groove formed in the first impurity diffused region;
    a second groove formed in the second impurity diffused region;
    an insulating film, formed over the semiconductor substrate, including a hole reaching the first groove and the second groove; and
    a metal material formed in the first groove, in the second groove, and in the hole.

2. The semiconductor wafer as claimed in claim 1, wherein the metal material forms one of a dummy contact plug and a dummy metal gate electrode.

3. The semiconductor wafer as claimed in claim 1, wherein the metal material is arranged in one of a chip region and a scribe region that divides the chip region.

* * * * *